United States Patent
Kim et al.

(10) Patent No.: US 9,484,554 B2
(45) Date of Patent: Nov. 1, 2016

(54) ORGANIC LIGHT-EMITTING DISPLAY APPARATUS

(71) Applicant: Samsung Display Co., Ltd., Yongin, Gyeonggi-Do (KR)

(72) Inventors: Minwoo Kim, Yongin (KR); Manseob Choi, Yongin (KR); Geebum Kim, Yongin (KR); Katsumasa Yoshii, Yongin (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/590,653

(22) Filed: Jan. 6, 2015

(65) Prior Publication Data

US 2016/0020430 A1    Jan. 21, 2016

(30) Foreign Application Priority Data

Jul. 17, 2014 (KR) ........................ 10-2014-0090353

(51) Int. Cl.
    *H01L 27/32*      (2006.01)
    *H01L 51/52*      (2006.01)

(52) U.S. Cl.
    CPC ....... *H01L 51/5271* (2013.01); *H01L 27/3258* (2013.01); *H01L 51/5218* (2013.01)

(58) Field of Classification Search
    CPC ........... H01L 27/3258; H01L 51/5217; H01L 51/5271
See application file for complete search history.

(56) References Cited

U.S. PATENT DOCUMENTS

| | | | |
|---|---|---|---|
| 8,519,385 B2 | 8/2013 | Lim et al. | |
| 2006/0191177 A1 | 8/2006 | Engel | |
| 2010/0109511 A1 | 5/2010 | Kim et al. | |
| 2014/0061605 A1* | 3/2014 | Kim | G09G 3/3208 257/40 |
| 2015/0123952 A1 | 5/2015 | Kim et al. | |

FOREIGN PATENT DOCUMENTS

| | | |
|---|---|---|
| KR | 10-2010-0043943 A | 4/2010 |
| KR | 102010043943 a1 * | 4/2010 |
| KR | 10-2010-0048608 A | 5/2010 |
| KR | 10-2013-0044672 A | 5/2013 |
| KR | 10-2014-0030842 A | 3/2014 |
| KR | 10-2015-0051463 A | 5/2015 |

* cited by examiner

*Primary Examiner* — Raj R Gupta
(74) *Attorney, Agent, or Firm* — Knobbe Martens Olson & Bear LLP (57) ABSTRACT

An organic light-emitting display apparatus that has high-resolution and high-brightness includes a substrate comprising a major surface; an insulating layer disposed over the substrate and comprising a first inclined surface which is inclined with respect to the major surface and faces away from the substrate; a reflective first pixel electrode disposed over the first inclined surface and configured to cover a portion of the first inclined surface; a first intermediate layer disposed over the first pixel electrode and comprises a light emission layer; and a reflective opposite electrode disposed over the first intermediate layer.

20 Claims, 6 Drawing Sheets

ORGANIC LIGHT-EMITTING DISPLAY APPARATUS

RELATED APPLICATION

This application claims the benefit of Korean Patent Application No. 10-2014-0090353, filed on Jul. 17, 2014, in the Korean Intellectual Property Office, the disclosure of which is incorporated herein in its entirety by reference.

BACKGROUND

1. Field

One or more embodiments of the present invention relate to a display apparatus, and more particularly, to an organic light-emitting display apparatus.

2. Description of the Related Art

Generally, an organic light-emitting display apparatus has an organic light-emitting device which includes a pixel electrode and an opposite electrode, which oppose each other, and an intermediate layer including an emission layer, the intermediate layer being interposed between the pixel electrode and the opposite electrode. In the organic light-emitting display apparatus, light generated from the emission layer is emitted to the outside via the pixel electrode or the opposite electrode.

However, as a size of a pixel is reduced in order to realize a high-resolution organic light-emitting display apparatus, an emission area of the organic light-emitting display apparatus is also reduced, which may cause a decrease of brightness of the organic light-emitting display apparatus.

SUMMARY

One or more embodiments of the present invention include an organic light-emitting display apparatus having high-resolution and high brightness.

Additional aspects will be set forth in part in the description which follows and, in part, will be apparent from the description, or may be learned by practice of the presented embodiments.

According to one or more embodiments of the present invention, an organic light-emitting display apparatus includes: a substrate comprising a major surface; an insulating layer disposed over the substrate and comprising a first inclined surface which is inclined with respect to the major surface and faces away from the substrate; a reflective first pixel electrode disposed over the first inclined surface and configured to cover a portion of the first inclined surface; a first intermediate layer disposed over the first pixel electrode and includes a light emission layer; and a reflective opposite electrode disposed over the first intermediate layer.

The insulating layer may have a tip portion which is farthest from the substrate, and the first pixel electrode might not cover a portion of the first inclined surface far from the tip portion.

The first pixel electrode may have a first proximal portion which is proximate to the tip portion and a first distal portion which is far from the tip portion, and the first proximal portion may be thicker than the first distal portion. The emission layer may comprise a portion corresponding to the first distal portion.

The first pixel electrode may have a first proximal portion which is proximate to the tip portion and a first distal portion which is far from the tip portion, and the first proximal portion may have a multi-layered structure including more layers than a structure of the second distal portion.

The first inclined surface may have a first proximal inclined surface which is proximate to the tip portion and a first distal inclined surface, and an inclination angle of the first proximal inclined surface with respect to the major surface of the substrate may be greater than an inclination angle of the first distal inclined surface with respect to the substrate.

The first pixel electrode may have a first proximal portion which is proximate to the tip portion and a first distal portion which is far from the tip portion, and the organic light-emitting display apparatus may further include a first pixel-defining layer which covers a lower end portion of the first pixel electrode and a portion of the first inclined surface that is not covered by the first pixel electrode, wherein the first pixel-defining layer comprises a portion that does not overlap the first electrode when viewed in a direction perpendicular to the major surface. The opposite electrode may comprise a portion formed over the first pixel-defining layer.

The inclined insulating layer may have a tip portion which is farthest from the substrate and a second inclined surface which is separated from the first inclined surface by the tip portion, and an inclination angle of the second inclined surface with respect to the major surface of the substrate may be greater than an inclination angle of the first inclined surface with respect to the substrate.

The inclined insulating layer may have a tip portion which is farthest from the substrate and a second inclined surface which is separated from the first inclined surface by the tip portion. The organic light-emitting display apparatus may further include: a reflective second pixel electrode disposed over the second inclined surface and configured to cover a portion of the second inclined surface; and a second intermediate layer disposed over the second pixel electrode and includes a light emission layer, wherein the opposite electrode comprises a portion formed over the second intermediate layer.

The second pixel electrode may cover a portion of the second inclined surface proximate to the tip portion and may not cover a portion of the second inclined surface far from the tip portion.

The second pixel may have a second proximal portion which is proximate to the tip portion and a second distal portion which is far from the tip portion, and the second proximal portion may be thicker than the second distal portion. The light emission layer may comprise a portion corresponding to the second distal portion.

The second pixel electrode may have a second proximal portion which is proximate to the tip portion and a second distal portion which is far from the tip portion, and the second proximal portion may have a multi-layered structure including more layers than a structure of the second distal portion.

The second inclined surface may have a second proximal inclined surface which is proximate to the tip portion and a second distal inclined surface, and an inclination angle of the second proximal inclined surface with respect to the major surface of the substrate may be greater than an inclination angle of the second distal inclined surface with respect to the substrate.

The second pixel electrode may have a second proximal portion which is proximate to the tip portion and a second distal portion which is far from the tip portion. The organic light-emitting display apparatus may further include a second pixel-defining layer which covers a lower end portion of the second pixel electrode and a portion of the second inclined surface that is not covered by the second pixel electrode, wherein the second pixel-defining layer comprises a portion that does not overlap the second electrode when viewed in a direction perpendicular to the major surface. The opposite electrode may comprise a portion formed over the second pixel-defining layer.

In the foregoing apparatus, the first pixel electrode may comprise a third inclined surface which is inclined with respect to the major surface and faces away from the substrate, wherein the third inclined surface may have an angle with respect to the major surface greater than that of the first inclined surface. The first pixel electrode may comprise a third inclined surface which is inclined with respect to the major surface and faces away from the substrate, wherein the opposite electrode may comprise a fourth inclined surface which is inclined with respect to and opposes the third inclined surface, wherein the third inclined surface may have an angle with respect to the major surface greater than that of the fourth inclined surface. The first pixel electrode may comprise a third inclined surface which is inclined with respect to the major surface and faces away from the substrate, wherein the opposite electrode may comprise a fourth inclined surface which is inclined with respect to and opposes the third inclined surface of the first pixel electrode, wherein the third and fourth inclined surfaces may be arranged such that light beams emitted from the light emission layer progress toward a lower end portion of the first pixel electrode while reflecting by the third and fourth inclined surfaces.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items.

It will be understood that when a layer, region, or component is referred to as being "formed on" another layer, region, or component, it can be directly or indirectly formed on the other layer, region, or component. That is, for example, intervening layers, regions, or components may be present. Also, the sizes of elements in the drawings may be exaggerated for convenience of explanation. In other words, since the sizes and thicknesses of components in the drawings are arbitrarily illustrated for convenience of explanation, the following embodiments are not limited thereto.

In the following examples, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

Figure 1:
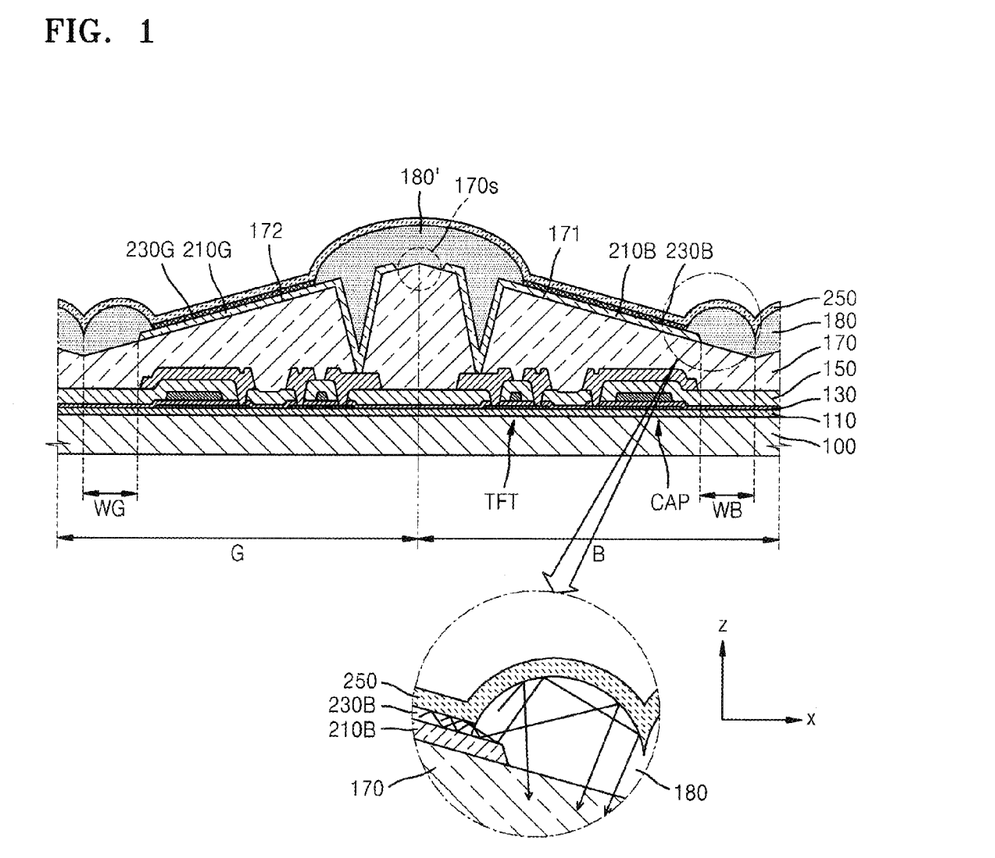
FIG. 1 is a cross-sectional view of an organic light-emitting display apparatus according to an embodiment of the present invention.

FIG. 1 is a cross-sectional view of an organic light-emitting display apparatus according to an embodiment of the present invention. The organic light-emitting display apparatus includes an array of pixels. FIG. 1 illustrates at least one pixel among the plurality of pixels. The organic light-emitting display apparatus according to the present embodiment includes a substrate 100, an inclined insulating layer 170, a first pixel electrode 210B, a first intermediate layer, and an opposite electrode 250. The organic light-emitting display apparatus may further include various components as illustrated in FIG. 1.

The substrate 100 may be formed of various materials, for example, a glass material or a plastic material such as polyethylene terephthalate (PET), polyethylen naphthalate (PEN), and polyimide. The substrate 100 may also include a light-transmittance material as it will be described later.

The inclined insulating layer 170 is disposed over a major surface of the substrate 100 and has a first inclined surface 171 which is inclined with respect to the major surface of the substrate 100 and faces away from the substrate 100. In embodiments, the first inclined surface 171 is not parallel to the substrate 100. As illustrated in FIG. 1, as the first inclined surface 171 of the inclined insulating layer 170 is toward a +x direction, the first inclined surface 171 is inclined toward a −z direction. The inclined insulating layer 170 may be formed of various materials by using patterning via a gray scale photomask or a photoresist. An inorganic material, such as silicon oxide or silicon nitride, and an organic material, such as polyimide or acryl, may be used. As illustrated in FIG. 1, the inclined insulating layer 170 has a tip portion 170s which is farthest from the substrate 100.

The first pixel electrode 210B is placed on the first inclined surface 171 of the inclined insulating layer 170. The first pixel electrode 210B is a reflection electrode. For example, the first pixel electrode 210B may include a reflective layer formed of Ag, Mg, Al, Pt, Pd, Au, Ni, Nd, Ir, Cr, or a combination thereof, and a layer formed of ITO, IZO, ZnO, or $In_2O_3$. Of course, the structure and material of the first pixel electrode 210B is not limited thereto and various modifications are possible.

The first pixel electrode 210B covers a portion of the first inclined surface 171 of the inclined insulating layer 170. In detail, as illustrated in FIG. 1, the first pixel electrode 210B is disposed to cover a portion of the first inclined surface 171 that is proximate to the tip portion 170s, whereas the first pixel electrode 210B does not cover a portion of the first inclined surface 171 that is far from the tip portion 170s. Accordingly, the first pixel electrode 210B has a first proximal portion which is proximate to the tip portion 170s and a first distal portion which is far from the tip portion 170s. According to necessity, the first distal portion may be a portion which is farthest from the tip portion 170s. The same applies to embodiments to be described later and their modifications. As will be described later, the portion of the first inclined surface 171 that is far from the tip portion 170s and thus not covered by the first pixel electrode 210B may function as a transmittance window WB.

Meanwhile, the first distal portion of the first pixel electrode 210B and the portion of the first inclined surface 171 not covered by the first pixel electrode 210B may be covered by a first pixel-defining layer 180. The pixel-defining layer 180 may increase a distance between an end of the first pixel electrode 210B and the opposite electrode 250 above the first pixel electrode 210B, thereby preventing an electric arc from occurring at the end of the first pixel electrode 210B. Also, the first pixel-defining layer 180 may have a shape convex toward an upper end thereof (a +z direction) in order to correspond to the transmittance window WB, and thus, may control a direction of light so that the light is emitted to the outside via the transmittance window WB. This will be described later.

In addition to the above-described components, the organic light-emitting display apparatus may include as illustrated in FIG. 1 a thin film transistor TFT or a capacitor Cap placed on the substrate 100. Also, the organic light-emitting display apparatus may further include a buffer layer 110 for preventing impurities from penetrating into a semiconductor layer of the thin film transistor TFT, a gate insulating layer 130 for insulating the semiconductor layer of the thin film transistor TFT and a gate electrode, an interlayer insulating layer 150 for insulating a source electrode and a drain electrode of the thin film transistor TFT and the gate electrode, and the like. Furthermore, the organic light-emitting display apparatus may also include a passivation layer (not shown) covering the thin film transistor TFT.

In embodiments, the first intermediate layer may have a multi-layered structure including a blue-light emission layer 230B. In this case, unlike the illustration of FIG. 1, the first intermediate layer may have some layers which are integrated common layers approximately corresponding to the entire surface of the substrate 100 and other layers which are pattern layers patterned to correspond to the first pixel electrode 210B. In detail, the blue-light emission layer 230B may be a pattern layer patterned to correspond to the first pixel electrode 210B and at least some other layers may be common layers which are integrated to approximately correspond to the entire surface of the substrate 100. The first intermediate layer may be formed of a small molecular-weight material or a high molecular-weight material and may include a hole injection layer, a hole transport layer, an emission layer, an electron transport, and/or an electron injection layer. The first intermediate layer may be formed by deposition, spin coating, inkjet printing, and/or laser heat transferring.

The opposite electrode 250 may be integrally formed with a plurality of pixel electrodes. That is, the opposite electrode 250 may be integrally formed to approximately correspond to the entire surface of the substrate 100. The opposite electrode 250 is a reflection electrode. For example, the opposite electrode 250 may include a reflective layer formed of Ag, Mg, Al, Pt, Pd, Au, Ni, Nd, Ir, Cr, Li, Ca, or a combination thereof. The structure and material of the opposite electrode 250 are not limited thereto and various modifications are possible. The opposite electrode 250 is placed above the first intermediate layer and extends onto the first pixel-defining layer 180 to cover the first pixel-defining layer 180.

According to the organic light-emitting display apparatus according to the present embodiment, light generated from the emission layer 230B of the first intermediate layer is repeatedly reflected between the first pixel electrode 210B and the opposite electrode 250 and is then emitted to the outside via the transmittance window WB, which is the portion of the first inclined surface 171 of the inclined insulating layer 170 that is not covered by the first pixel electrode 210B. An area of the emission layer 230B of the first intermediate layer of the organic light-emitting display apparatus according to the present embodiment is larger than an area of the emission layer 230B of the first intermediate layer of an organic light-emitting display apparatus which does not include the inclined insulating layer 170 so that the emission layer 230B of the first intermediate layer is approximately parallel to the substrate 100. Thus, even if a size of a sub-pixel B decreases, the emission layer 230B of the first intermediate layer may have a sufficient area, and thus, an amount of light generated from the emission layer 230B of the first intermediate layer may be increased. Also, the light generated from the emission layer 230B of the first intermediate layer is gathered by using the reflective first pixel electrode 210B and the reflective opposite electrode 250 so as to be emitted to the outside via the transmittance window WB. Thus, straightness of the light emission may be increased, and thus, a visibility of the organic light-emitting display apparatus at a front side may be further improved.

Particularly, since the first pixel-defining layer 180 is formed to have the convex shape toward the upper end thereof (the +z direction) in order to correspond to the transmittance window WB, a bottom surface of the opposite electrode 250 in a direction of the first pixel-defining layer 180 may serve as a concave mirror so as to control a direction of light so that the light is emitted to the outside via the transmittance window WB.

Meanwhile, as illustrated in FIG. 1, a sub-pixel G, which immediately neighbor the sub-pixel B, may be formed to form a symmetrical structure with respect to the sub-pixel B. That is, the inclined insulating layer 170 may be formed such that a second inclined surface 172 thereof, the second inclined surface 172 and the first inclined surface 171 being symmetrical with respect to with the tip portion 170s, and a portion of the second inclined surface 172 may be covered by a reflective second pixel electrode 210G. In this case, an emission layer 230G of a second intermediate layer which includes an emission layer may be disposed on the second pixel electrode 210G and the opposite electrode 250 may extend onto the second intermediate layer. The second intermediate layer may have the same/similar structure as/to the first intermediate layer described above. Accordingly, the emission layer 230G (a green light emission layer) of the second intermediate layer may be formed to correspond to the second pixel electrode 210G. Similarly with the first pixel electrode 210B, the second pixel electrode 210G covers a portion of the second inclined surface 172 which is proximate to the tip portion 170s and does not cover a portion of the second inclined surface 172 that is far from the tip portion 170s. Accordingly, the second pixel electrode 210G has a second proximal portion which is proximate to the tip portion 170s and a second distal portion which is far from the tip portion 170s. Accordingly, the portion of the second inclined surface 172 that is not covered by the second pixel electrode 210G may serve as a transmittance window WG. According to necessity, the second distal portion may be a portion of the second pixel electrode 210G that is farthest from the tip portion 170s.

The second distal portion of the second pixel electrode 210G and the portion of the second inclined surface 172 that is not covered by the second pixel electrode 210G may be covered by a second pixel-defining layer 180. The first pixel-defining layer 180 and second pixel-defining layer 180 may be formed as one body. The second pixel-defining layer 180 may increase a distance between an end of the second pixel electrode 210G and the opposite electrode 250 above the second pixel electrode 210G, thereby preventing an electric arc from occurring at the end of the second pixel electrode 210G. Also, the second pixel-defining layer 180 may have a shape which is convex toward an upper end thereof (the +z direction) in order to correspond to the transmittance window WB, and thus, may control a direction of light so that the light is emitted to the outside via the transmittance window WB.

Particularly, since the second pixel-defining layer 180 is formed as presented above, a bottom surface of the opposite electrode 250 in a direction of the second pixel-defining layer 180 may serve as a concave mirror so as to control a direction of light so that the light is emitted to the outside via the transmittance window WB.

In addition to the first pixel-defining layer 180 and the second pixel-defining layer 180, the organic light-emitting display apparatus may further include an additional pixel-defining layer 180' which covers the portion of the first pixel electrode 210B proximate to the tip portion 170s and the portion of the second pixel electrode 210G proximate to the tip portion 170s. The additional pixel-defining layer 180' may be formed simultaneously with and of the same material as the first pixel-defining layer 180 and the second pixel-defining layer 180. The first pixel-defining layer 180, the second pixel-defining layer 180, and the additional pixel-defining layer 180' may be formed as one body. Alternatively, according to necessity, the additional pixel-defining layer 180' may be formed of a material different from that of the first pixel-defining layer 180 and the second pixel-defining layer 180. For example, the additional pixel-defining layer 180' may be formed of a material through which light does not pass. By doing so, light generated from the emission layer 230B of the first intermediate layer and light generated from the emission layer 230G of the second intermediate layer may be prevented from being mixed with each other.

Figure 2:
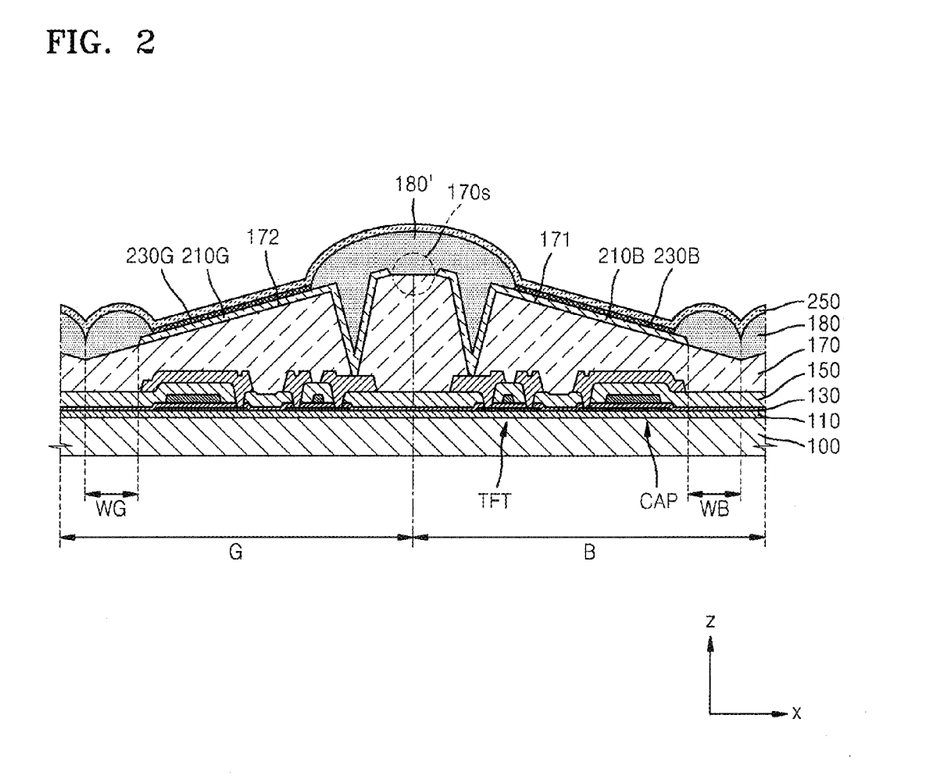
FIG. 2 is a cross-sectional view of an organic light-emitting display apparatus according to another embodiment of the present invention.

Meanwhile, the tip portion 170s of the inclined insulating layer 170 does not necessarily have to have a pointed shape as illustrated in FIG. 1. For example, as illustrated in FIG. 2, which is a cross-sectional view of an organic light-emitting display apparatus according to another embodiment of the present invention, the tip portion 170s of the inclined insulating layer 170 may have a flat upper surface. Accordingly, the inclined insulating layer 170 may have an approximately overall ladder shape with respect to the sub-pixels B and G.

Figure 3:
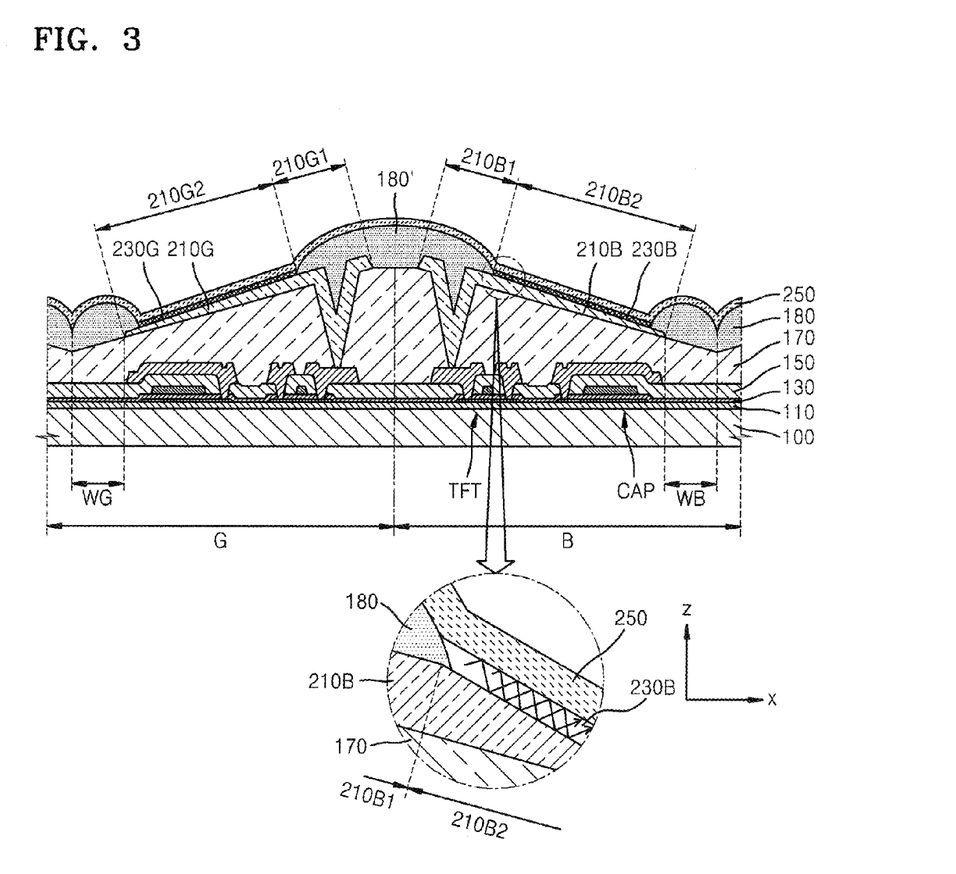
FIG. 3 is a cross-sectional view of an organic light-emitting display apparatus according to another embodiment of the present invention.

FIG. 3 is a cross-sectional view of an organic light-emitting display apparatus according to another embodiment of the present invention. Also in the case of the organic light-emitting display apparatus according to the present embodiment, the first pixel electrode 210B has the first proximal portion which is proximate to the tip portion 170s and the first distal portion which is far from the tip portion 170s. A thickness of the first proximal portion of the first pixel electrode 210B, which is proximate to the tip portion 170s, may be greater than a thickness of the first distal portion of the first pixel electrode 210B, which is far from the tip portion 170s. In embodiments, the first pixel electrode 210B includes an inclined surface inclined with respect to the major surface of the substrate and facing away from the substrate, and has an angle with respect to the major surface of the substrate which is greater than that of the inclined surface 172 of the insulating layer 170.

As described above, both of the first pixel electrode 210B and the opposite electrode 250 are reflection electrodes. Also, the light generated from the emission layer 230B of the first intermediate layer is repeatedly reflected between the first pixel electrode 210B and the opposite electrode 250 until the light is emitted to the outside via the transmittance window WB. Thus, when the light generated from the emission layer 230B of the first intermediate layer is repeatedly reflected between the first pixel electrode 210B and the opposite electrode 250, there is a need to increase a probability that the light is guided toward the transmittance window WB.

According to the organic light-emitting display apparatus according to the present embodiment, the first proximal portion of the first pixel electrode 210B, the first proximal portion being proximate to the tip portion 170s, has a greater thickness than the first distal portion which is far from the tip portion 170s. Accordingly, an upper surface of the first pixel electrode 210B in a direction of the opposite electrode 250 may have a higher inclination with respect to the substrate 100, and thus, when the light generated from the emission layer 230B of the first intermediate layer is repeatedly reflected between the first pixel electrode 210B and the opposite electrode 250, the probability that the light is guided toward the transmittance window WB may be higher.

Meanwhile, as illustrated in FIG. 3 and according to necessity, the first distal portion 210B2 of the first pixel electrode 210B may be understood as a portion of the first pixel electrode 210 not including the first proximal portion 210B1 of the first pixel electrode 210B and the first proximal portion 210B1 proximate to the tip portion 170s of the inclined insulating layer 170. In this case, the emission layer may be placed to correspond to the first distal portion 210B2.

As illustrated in FIG. 3, the second pixel electrode 210G may have a structure similar to the structure of the first pixel electrode 210B. That is, also in the case of the second pixel electrode 210G, a thickness of a second proximal portion of the second pixel electrode 210G, the second proximal portion being proximate to the tip portion 170s, may be greater than a thickness of a second distal portion of the second pixel electrode 210G, the second distal portion being far from the tip portion 170s. Accordingly, an upper surface of the second pixel electrode 210G in the direction of the opposite electrode 250 may have a higher inclination with respect to the substrate 100. Thus, when the light generated from the emission layer 230G of the second intermediate layer is repeatedly reflected between the second pixel electrode 210G and the opposite electrode 250, the probability that the light is guided toward the transmittance window WB may increase.

Meanwhile, as illustrated in FIG. 3, the second distal portion of the second pixel electrode 210G may be understood as a portion of the second pixel electrode 210G not including the second proximal portion of the second pixel electrode 210G proximate to the tip portion 170s of the inclined insulating layer 170. In this case, the emission layer may be placed to correspond to the second distal portion.

Figure 4:
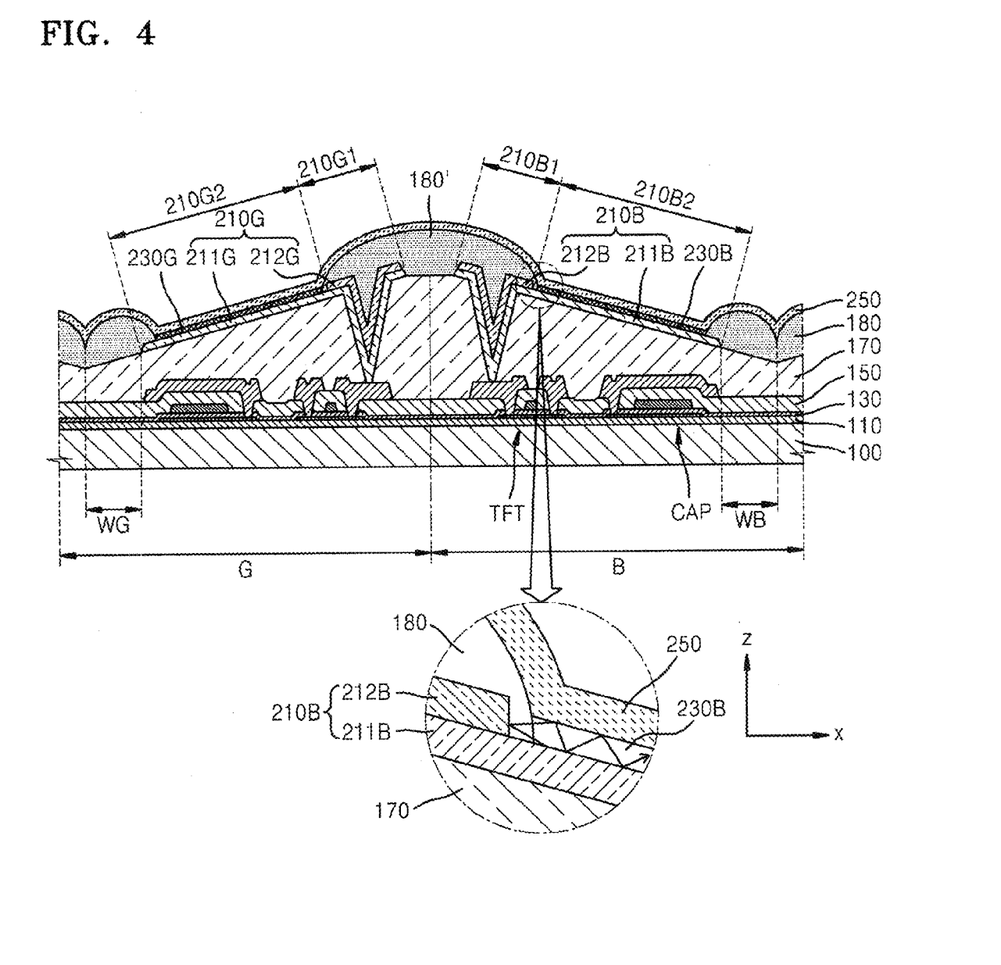
FIG. 4 is a cross-sectional view of an organic light-emitting display apparatus according to another embodiment of the present invention.

FIG. 4 is a cross-sectional view of an organic light-emitting display apparatus according to another embodiment of the present invention. According to the organic light-emitting display apparatus according to the present embodiment, the first pixel electrode 210B has a double-layered structure. A portion of the first pixel electrode 210B proximate to the tip portion 170s has a double-layered structure, and a portion of the first pixel electrode 210B far from the tip portion 170s has a single-layered structure.

As described above, both the first pixel electrode 210B and the opposite electrode 250 are reflection electrodes. Thus, light generated from the emission layer 230B of the first intermediate layer is repeatedly reflected between the first pixel electrode 210B and the opposite electrode 250 until the light is emitted to the outside via the transmittance window WB. Thus, there is a need to increase the probability that the light is guided toward the transmittance window WB.

According to the organic light-emitting display apparatus of the present embodiment, the first proximal portion of the first pixel electrode 210B, which is proximate to the tip portion 170s, has the double-layered structure and the first distal portion of the first pixel electrode 210B, which is far from the tip portion 170s, has the single-layered structure. Accordingly, even if a portion of the light generated from the emission layer 230B of the first intermediate layer moves in a direction of the tip portion 170s instead of the direction of the transmittance window WB, the light may be reflected by an inclined surface of a first upper electrode 212B of the portion of the first pixel electrode 210B, which is proximate to the tip portion 170s, and then, may be repeatedly reflected between a first lower electrode 211B of the first pixel electrode 210B and the opposite electrode 250 so as to be guided toward the transmittance window WB. In this case, as illustrated in FIG. 4, the emission layer 230B of the first intermediate layer may be placed to correspond to the first lower electrode 211B of the first pixel electrode 210B. If the first distal portion of the first pixel electrode 210B has a multi-layered structure, the first proximal portion of the first pixel electrode 210B may have a multi-layered structure having more layers than the first distal portion.

As illustrated in FIG. 4, the second pixel electrode 210G may have a structure similar to the structure of the first pixel electrode 210B. That is, the second proximal portion of the second pixel electrode 210G proximate to the tip portion 170s has the double-layered structure and the second distal portion of the second pixel electrode 210G far from the tip portion 170s has the single-layered structure. Accordingly, even if a portion of the light generated from the emission layer 230G of the second intermediate layer moves in the direction of the tip portion 170s instead of the direction of the transmittance window WB, the light may be reflected by an inclined surface of a second upper electrode 212G of the portion of the second pixel electrode 210G, which is proximate to the tip portion 170s, and then, may be repeatedly reflected between a second lower electrode 211G of the second pixel electrode 210G and the opposite electrode 250 so as to be guided toward the transmittance window WB direction. In this case, as illustrated in FIG. 4, the emission layer 230G of the second intermediate layer may be placed to correspond to the second lower electrode 211G of the second pixel electrode 210G. If the second distal portion of the second pixel electrode 210G has a multi-layered structure, the second proximal portion of the second pixel electrode 210G may have a multi-layered structure having more layers than the second distal portion.

Figure 5:
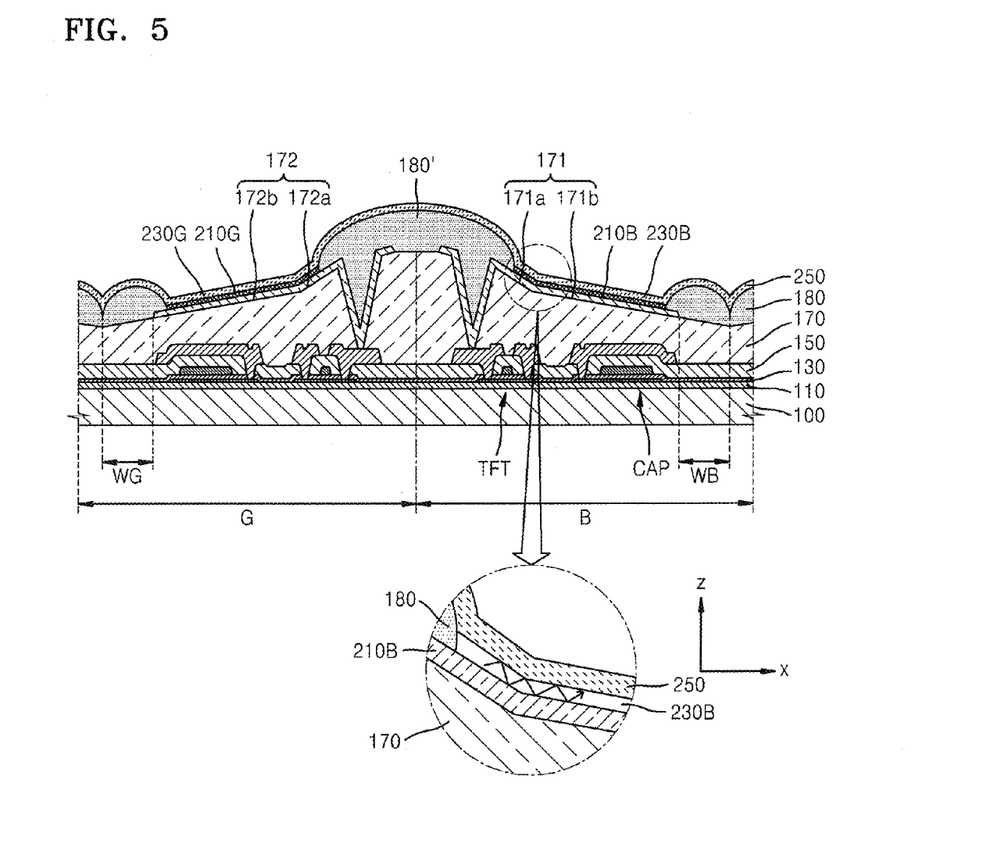
FIG. 5 is a cross-sectional view of an organic light-emitting display apparatus according to another embodiment of the present invention.

FIG. 5 is a cross-sectional view of an organic light-emitting display apparatus according to another embodiment of the present invention. According to the organic light-emitting display apparatus of the present embodiment, the shape of the first inclined surface 171 is different from the organic light-emitting display apparatus according to the embodiment illustrated in FIG. 2. According to the organic light-emitting display apparatus of the present embodiment, the first inclined surface 171 has a first proximal inclined surface 171a which is proximate to the tip portion 170s and a first distal inclined surface 171b which is separated from the tip portion 170s by the first proximal inclined surface 171a. An inclination angle of the first proximal inclined surface 171a with respect to the substrate 100 is larger than an inclination angle of the first distal inclined surface 171b with respect to the substrate 100.

As described above, the first pixel electrode 210B and the opposite electrode 250 are reflection electrodes. Thus, the light generated from the emission layer 230B of the first intermediate layer is repeatedly reflected between the first pixel electrode 210B and the opposite electrode 250 until the light is emitted to the outside via the transmittance window WB. Accordingly, there is a need to increase the probability that the light is guided toward the transmittance window WB.

According to the organic light-emitting display apparatus of the present embodiment, the first inclined surface 171 has the first proximal inclined surface 171a and the first distal inclined surface 171b, and the inclination angle of the first proximal inclined surface 171a with respect to the substrate 100 is larger than the inclination angle of the first distal inclined surface 171b with respect to the substrate 100. Accordingly, in the vicinity of the tip portion 170s, the upper surface of the first pixel electrode 210B in the direction of the opposite electrode 250 may have a higher inclination angle with respect to the substrate 100, and thus, when the light generated from the emission layer 230B of the first intermediate layer is repeatedly reflected between the first pixel electrode 210B and the opposite electrode 250, the probability that the light is guided toward the transmittance window WB increases.

As illustrated in FIG. 5, the second inclined surface 172 may have a structure similar to the structure of the first inclined surface 171. That is, the second inclined surface 172 has a second proximal inclined surface 172a and a second distal inclined surface 172b, and an inclination angle of the second proximal inclined surface 172a with respect to the substrate 100 may be larger than an inclination angle of the second distal inclined surface 172b with respect to the substrate 100. Accordingly, in the vicinity of the tip portion 170s, the upper surface of the second pixel electrode 210G in the direction of the opposite electrode 250 may have a higher inclination angle with respect to the substrate 100, and thus, when the light generated from the emission layer 230G of the second intermediate layer is repeatedly reflected between the second pixel electrode 210G and the opposite electrode 250, the probability that the light is guided toward the transmittance window WB increases.

Figure 6:
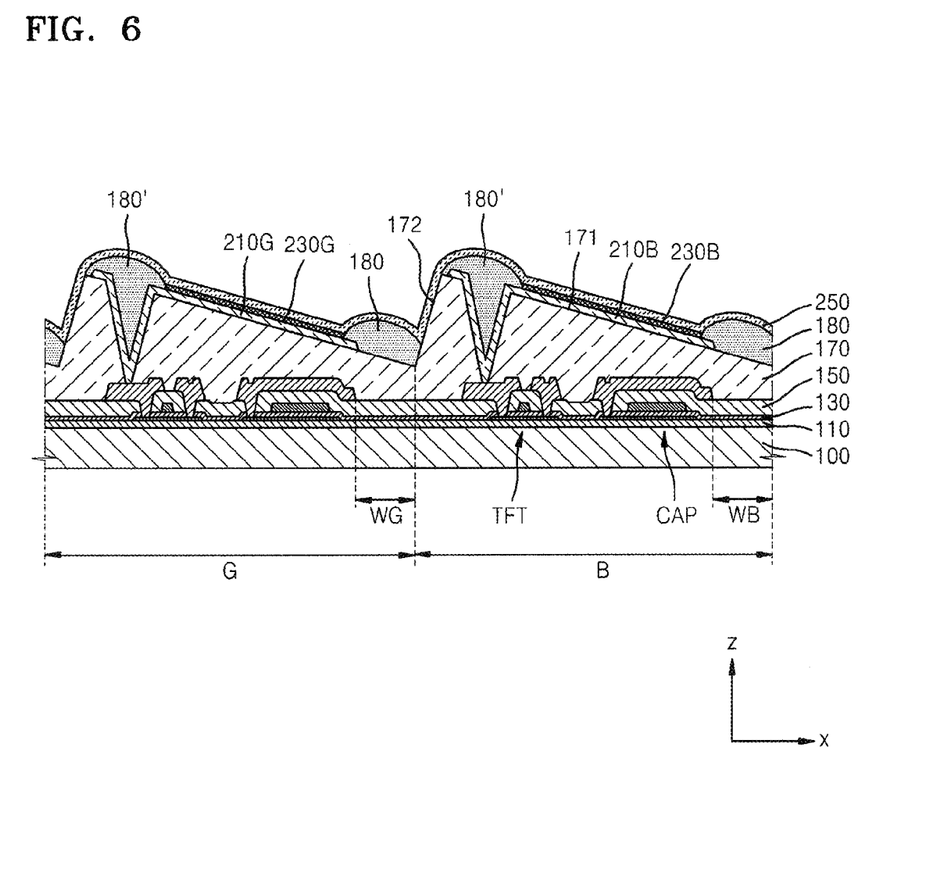
FIG. 6 is a cross-sectional view of an organic light-emitting display apparatus according to another embodiment of the present invention.

FIG. 6 is a cross-sectional view of an organic light-emitting display apparatus according to another embodiment of the present invention. As illustrated in FIG. 6, the inclined insulating layer 170 has a tip portion which is farthest from the substrate 100 and the second inclined surface 172 which is spaced apart from the first inclined surface 171 by the tip portion. An inclination angle of the second inclined surface 172 with respect to the substrate 100 may be larger than an inclination angle of the first inclined surface 171 with respect to the substrate 100.

Accordingly, as illustrated in FIG. 6, the sub-pixels B and G may have an identical structure. That is, the first pixel electrode 210B is placed on the first inclined surface 171 in the sub-pixel B and the second pixel electrode 210G may be placed on the first inclined surface 171 in the sub-pixel G. Also, the portion of the first pixel electrode 210B, which is proximate to the tip portion, may be covered by the additional pixel-defining layer 180' and the portion of the second pixel electrode 210G, which is proximate to the tip portion, may be covered by the additional pixel-defining layer 180'. The portion of the first pixel electrode 210B, which is far from the tip portion, may be covered by the pixel-defining layer 180 and the portion of the second pixel electrode 210G, which is far from the tip portion (that is, a portion proximate to the second inclined surface 172 of the sub-pixel B), may be covered by the pixel-defining layer 180.

According to the organic light-emitting display apparatus of the present embodiment, an area of the emission layer 230B of the first intermediate layer or an area of the emission layer 230G of the second intermediate layer may be larger than an area of the emission layer 230B of the first intermediate layer or an area of the emission layer 230G of the second intermediate layer, which does not include the inclined insulating layer 170, so that the emission layer 230B of the first intermediate layer or the emission layer 230G of the second intermediate layer is formed approximately parallel to the substrate 100. Thus, even if a size of the sub-pixels B and G becomes smaller, the emission layer 230B of the first intermediate layer and the emission layer 230G of the second intermediate layer may be formed to have sufficient areas. Thus, an overall amount of light generated from the emission layer 230B of the first intermediate layer or the emission layer 230G of the second intermediate layer may be increased. Also, the light generated from the emission layer 230B of the first intermediate layer or the emission layer 230G of the second intermediate layer is gathered by the reflective first and second pixel electrodes 210B and 210G and the reflective opposite electrode 250 so as to be emitted to the outside via the transmittance window WB. Thus, straightness of the light emission may be increased, and thus, the visibility of the organic light-emitting display apparatus at a front side may be further improved.

As described above, according to the one or more of the above embodiments of the present invention, organic light-emitting display apparatuses of high-resolution having high brightness may be realized.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made herein without departing from the spirit and scope of the present invention as defined by the following claims.

What is claimed is:

1. An organic light-emitting display apparatus comprising:
   a substrate comprising a major surface;
   an insulating layer disposed over the substrate and comprising a first inclined surface which is inclined with respect to the major surface and faces away from the substrate wherein the insulation layer has a tip portion which is farthest from the substrate and has a surface that is inclined with respect to the major surface, and the first pixel electrode does not cover a portion of the first inclined surface far from the tip portion;
   a reflective first pixel electrode disposed over the first inclined surface and configured to cover a portion of the first inclined surface;
   a first intermediate layer disposed over the first pixel electrode and comprises a light emission layer; and
   a reflective opposite electrode disposed over the first intermediate layer.

2. The organic light-emitting display apparatus of claim 1 wherein the first pixel electrode has a first proximal portion which is proximate to the tip portion and a first distal portion which is far from the tip portion, and the first proximal portion is thicker than the first distal portion.

3. The organic light-emitting display apparatus of claim 2, wherein the light emission layer comprises a portion corresponding to the first distal portion.

4. The organic light-emitting display apparatus of claim 1, wherein the first pixel electrode has a first proximal portion which is proximate to the tip portion and a first distal portion which is far from the tip portion, and the first proximal portion has a multi-layered structure including more layers than a structure of the second distal portion.

5. The organic light-emitting display apparatus of claim 1, wherein the first inclined surface has a first proximal inclined surface which is proximate to the tip portion and a first distal inclined surface, and an inclination angle of the first proximal inclined surface with respect to the major surface of the substrate is greater than an inclination angle of the first distal inclined surface with respect to the substrate.

6. The organic light-emitting display apparatus of claim 1, wherein the first pixel electrode has a first proximal portion which is proximate to the tip portion and a first distal portion which is far from the tip portion,
   and the organic light-emitting display apparatus further comprises a first pixel-defining layer which covers a lower end portion of the first pixel electrode and a portion of the first inclined surface that is not covered by the first pixel electrode, wherein the first pixel-defining layer comprises a portion that does not overlap the first pixel electrode when viewed in a direction perpendicular to the major surface.

7. The organic light-emitting display apparatus of claim 6, wherein the opposite electrode comprises a portion formed over the first pixel-defining layer.

8. The organic light-emitting display apparatus of claim 1, wherein the insulating layer has a tip portion which is farthest from the substrate and a second inclined surface which is separated from the first inclined surface by the tip portion, and an inclination angle of the second inclined surface with respect to the major surface of the substrate is greater than an inclination angle of the first inclined surface with respect to the substrate.

9. The organic light-emitting display apparatus of claim 1, wherein the insulating layer has a tip portion which is farthest from the substrate and a second inclined surface which is separated from the first inclined surface by the tip portion,
   and further comprising:
   a reflective second pixel electrode disposed over the second inclined surface and configured to cover a portion of the second inclined surface; and
   a second intermediate layer disposed over the second pixel electrode and comprises a light emission layer, wherein the opposite electrode comprises a portion formed over the second intermediate layer.

10. The organic light-emitting display apparatus of claim 9, wherein the second pixel electrode covers a portion of the second inclined surface proximate to the tip portion and does not cover a portion of the second inclined surface far from the tip portion.

11. The organic light-emitting display apparatus of claim 10, wherein the second pixel electrode has a second proximal portion which is proximate to the tip portion and a second distal portion which is far from the tip portion, and the second proximal portion is thicker than the second distal portion.

12. The organic light-emitting display apparatus of claim 11, wherein the light emission layer comprises a portion corresponding to the second distal portion.

13. The organic light-emitting display apparatus of claim 10, wherein the second pixel electrode has a second proximal portion which is proximate to the tip portion and a second distal portion which is far from the tip portion, and the second proximal portion has a multi-layered structure including more layers than a structure of the second distal portion.

14. The organic light-emitting display apparatus of claim 10, wherein the second inclined surface has a second proximal inclined surface which is proximate to the tip portion and a second distal inclined surface, and an inclination angle of the second proximal inclined surface with respect to the major surface the substrate is greater than an inclination angle of the second distal inclined surface with respect to the substrate.

15. The organic light-emitting display apparatus of claim 10, wherein the second pixel electrode has a second proximal portion which is proximate to the tip portion and a second distal portion which is far from the tip portion, and the organic light-emitting display apparatus further comprises a second pixel-defining layer which covers a lower end portion of the second pixel electrode and a portion of the second inclined surface that is not covered by the second pixel electrode, wherein the second pixel-defining layer comprises a portion that does not overlap the second pixel electrode when viewed in a direction perpendicular to the major surface.

16. The organic light-emitting display apparatus of claim 15, wherein the opposite electrode comprises a portion formed over the second pixel-defining layer.

17. The organic light-emitting display apparatus of claim 1, wherein the first pixel electrode comprises a third inclined surface which is inclined with respect to the major surface and faces away from the substrate, wherein the third inclined surface has an angle with respect to the major surface greater than that of the first inclined surface.

18. The organic light-emitting display apparatus of claim 1, wherein the first pixel electrode comprises a third inclined surface which is inclined with respect to the major surface and faces away from the substrate, wherein the opposite electrode comprises a fourth inclined surface which is inclined with respect to and opposes the third inclined surface, wherein the third inclined surface has an angle with respect to the major surface greater than that of the fourth inclined surface.

19. The organic light-emitting display apparatus of claim 1, wherein the first pixel electrode comprises a third inclined surface which is inclined with respect to the major surface and faces away from the substrate, wherein the opposite electrode comprises a fourth inclined surface which is inclined with respect to and opposes the third inclined surface of the first pixel electrode, wherein the third and fourth inclined surfaces are arranged such that light beams emitted from the light emission layer progress toward a lower end portion of the first pixel electrode while reflecting by the third and fourth inclined surfaces.

20. The organic light-emitting display apparatus of claim 1, wherein the insulating layer has a tip portion which is farthest from the substrate, and the first pixel electrode does not cover the tip portion.

* * * * *